United States Patent [19]

Haddad et al.

[11] Patent Number: 4,774,197

[45] Date of Patent: Sep. 27, 1988

[54] METHOD OF IMPROVING SILICON DIOXIDE

[75] Inventors: Sameer S. Haddad, San Jose; Mong-Song Liang, Milpitas, both of Calif.

[73] Assignee: Advanced Micro Devices, Inc., Sunnyvale, Calif.

[21] Appl. No.: 875,111

[22] Filed: Jun. 17, 1986

[51] Int. Cl.$^4$ .................. H01L 21/265; B44C 1/22
[52] U.S. Cl. .................. 437/27; 148/DIG. 82; 437/24; 437/247
[58] Field of Search .................. 148/1.5, 187; 29/571, 29/576 B; 437/24, 247

[56] References Cited

U.S. PATENT DOCUMENTS

| | | | |
|---|---|---|---|
| 4,016,007 | 4/1977 | Wada et al. | 437/37 |
| 4,113,515 | 9/1978 | Kooi et al. | 148/1.5 |
| 4,177,084 | 12/1979 | Lau et al. | 148/1.5 |
| 4,305,086 | 12/1981 | Khajezadeh | 437/24 |
| 4,420,872 | 12/1983 | de Zaldivar | 437/24 |
| 4,514,251 | 4/1985 | Van Ommen et al. | 29/576 B |
| 4,564,394 | 1/1986 | Bussman | 148/1.5 |

FOREIGN PATENT DOCUMENTS 0024468  2/1980  Japan .................. 148/DIG. 77

OTHER PUBLICATIONS

Wada et al., Jap. Jour. Appl. Phys. 15 (1976) 1725.
Nesbit et al., Jour. Electrochem. Soc. 132 (1985) 2713.
Petruzzello et al., J. Appl. Phys. 58 (1985) 4605.
Kim et al., J. Electrochem. Soc. 131 (1984) 1935.

*Primary Examiner*—Upendra Roy
*Attorney, Agent, or Firm*—Gene Valet; Mark Miller; J. Vincent Tortolano

[57] ABSTRACT

A method of improving the integrity of silicon dioxide is disclosed. As applicable, for example, to the formation of oxide regions in an integrated circuit (such as thin, gate oxides) an implantation of nitrogen ions is performed prior to high temperature processing steps of the circuit fabrication. High temperature steps then result in silicon-nitrogen compounds being formed at the interfaces of the silicon dioxide regions with subjacent and superjacent regions of the integrated circuit structure. These compounds prevent the incursion of impurities into the silicon dioxide which would degrade its quality.

11 Claims, 6 Drawing Sheets

AUGER DEPTH PROFILE OF MOS STRUCTURE AFTER 1100°C ANNEALING

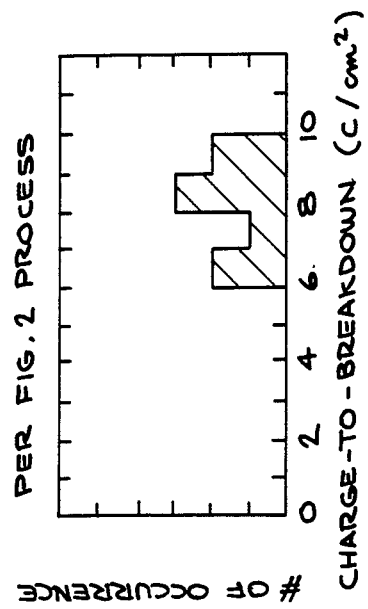
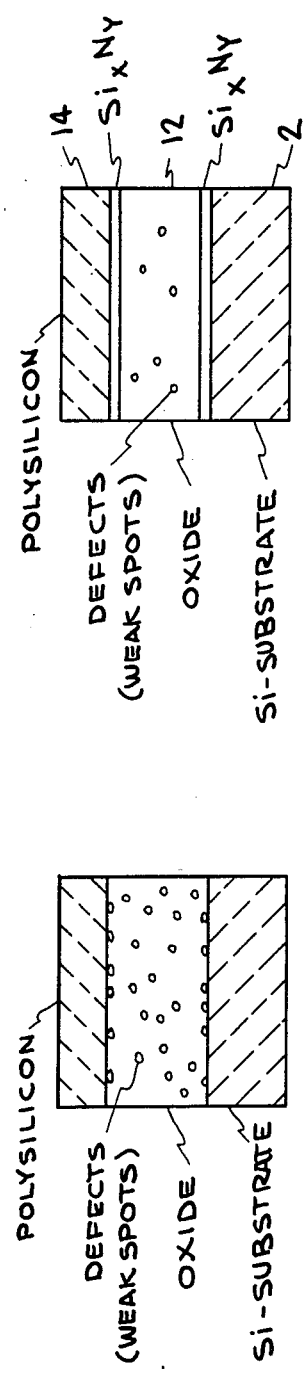
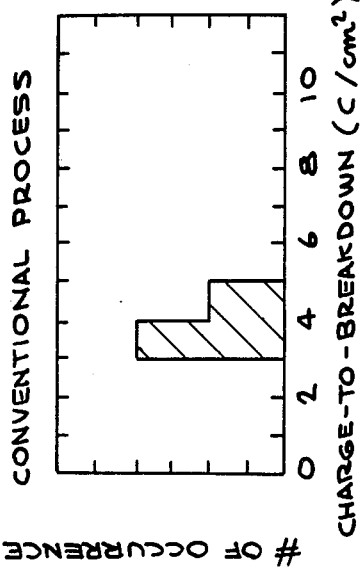

METHOD OF IMPROVING SILICON DIOXIDE

BACKGROUND OF THE INVENTION

1. Field of the Invention

The present invention generally relates to the fabrication of semiconductor materials, such as used in integrated circuits and, more particularly, to a method of reducing defects and improving the quality of silicon dioxide regions, especially such as thin oxide layers, in integrated circuit components.

2. Description of the Related Art

Silicon remains the most widely used semiconductor in the fabrication of integrated circuits (IC). One of the major reasons is an advantageous property of silicon that forms a stable oxide composition, silicon dioxide. This oxide provides a means of controlling the surface conditions of a silicon wafer on which the circuit is fabricated. Silicon dioxide can also act as a protective "mask" so that impurities can be intentionally inserted into specific regions of the silicon crystal lattice to alter conductivity characteristics and, hence, build discrete components in the silicon wafer. In other aspects of an IC device, silicon dioxide can be used as a dielectric or insulator for isolation of discrete components or elements of such components.

The basic oxidation process is the sharing of valence electrons between silicon and oxygen atoms to form four silicon-oxygen bonds. However, it is essentially impossible to grow absolutely perfect oxides. While impurity atoms are often deliberately introduced for the purpose of controlling electronic properties, impurity atoms can also be inadvertently incorporated as contaminants during the material formation or processing. Many of these contaminants are highly mobile in the oxide structure, e.g., alkali ions. In fact, contaminants are often introduced into an oxide layer from regions such as an adjacent silicon gate or subjacent silicon substrate during high-temperature manufacturing steps.

As a particular example, thin oxide regions are particularly susceptible to the effects of defects. Yet, for a metal-oxide-semiconductor (MOS) field effect transistor (FET) such as used in electrically erasable programmable read only memory (EEPROM) IC devices, it is desirable to use gate oxides in the sub-hundred Angstrom range of thicknesses. This is especially true in very large-scale integrated (VLSI) circuits; i.e., generally, those having more than 100,000 components per chip. For example, a 256,000 bit dynamic random access memory (DRAM) chip typically may have more than 600,000 components in a chip smaller than a fingernail.

Consider what happens if these contaminants are present in the thin gate oxide of an EEPROM transistor. An electric field is applied across the oxides in programming, erasing, and reading the data bit stored on the gate. The mobile contaminants can accumulate as a space-charge layer close to the silicon-oxide interface. This will cause a shift in the surface potential and, hence, will change the threshold voltage of the transistor. Moreover, on removal of the stress field, the space-charge becomes immobilized, resulting in a semipermanent change in the properties of the underlying material. Temperature changes can have the same effects. As a result, the defects impair the long-term stability of these devices.

All types of defects alter the electrical properties and operational characteristics of the IC device in which they are present. In practice, endurance of EEPROM devices is often determined by the integrity of sub-hundred Angstrom thin, gate oxides. VLSI circuits face serious reliability problems due to the quality of thin, gate oxides produced by current manufacturing techniques. (Current techniques are explained in depth in many classical texts, such as *Semiconductor & Integrated Circuit Fabrication Techniques*, Reston Publishing Co. Inc., copyright 1979 by the Fairchild Corporation; and *VLSI Fabrication Principles*, John Wiley & Sons, copyright 1983 by S. K. Ghandhi.)

Hence, there is a need for improvement in the quality of silicon dioxide layers, such as used as thin, gate oxides in FETs.

SUMMARY OF THE INVENTION

It is an object of the present invention to provide a method for reducing the defect density in semiconductor integrated circuit structure silicon dioxide regions.

It is another object of the present invention to provide a method for reducing the number of defects in thin, oxide layers of MOS devices.

It is yet another object of the present invention to provide a high quality of thin nitrided-oxide without resort to an ammonia anneal process step. (In the prior art, an annealing of silicon dioxide in the presence of ammonia gas is the most common technique from nitridization of silicon dioxide.)

It is yet a further object of the present invention to improve the endurance of EEPROM integrated circuit devices by improving the integrity of the thin, gate oxide layers in the MOSFET components thereof.

In a broad aspect, the present invention comprises a method of reducing defect density and, hence, improving the quality of silicon dioxide by forming silicon-nitrogen compounds at interface boundary regions within the silicon dioxide. For example, in the fabrication of integrated circuit component elements such as the thin, gate oxide regions of FETs, after implantation of nitrogen ions into the structure, boundary region silicon-nitrogen compounds can be formed when the silicon dioxide is submitted to subsequent relatively high temperature cycles.

Other objects, features and advantages of the present invention will become apparent upon consideration of the following detailed description and the accompanying drawings, in which like reference designations represent like features throughout the Figures.

BRIEF DESCRIPTION OF THE DRAWINGS

FIG. 6a is a schematic depiction in cross-section of an idealized structure formed in accordance with the prior art process as shown in FIG. 1;

FIG. 6b is a schematic depiction in cross-section of an idealized structure formed in accordance with the present invention as shown in FIGS. 2 and 2a through 2d;

FIG. 7a is a graphical representation of the charge-to-breakdown characteristic of thin oxides formed in accordance with the prior process of FIG. 1; and FIG. 7b is a graphical representation of the charge-to-breakdown characteristic of thin oxides formed in accordance with the present invention as depicted in FIG. 2.

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is made now, in detail, to a specific embodiment of the present invention which illustrates the best mode presently contemplated by the inventor for practicing the invention. Alternative embodiments are also briefly described as applicable. It will be intuitively obvious to a person skilled in the art that the invention taught herein will have wide applicability and that this description is merely one exemplary use. No limitations are intended or are to be inferred from this example.

The basic steps and techniques as described in the above-referenced texts can be generally employed in practicing the present invention. Moreover, the individual steps of such a process can be performed using commercially available integrated circuit fabrication machines. As specifically helpful to an understanding of the present invention, approximate technical data are set forth based upon the fabrication of the exemplary embodiment described using current technology. Future developments in this art may call for appropriate adjustments as would be obvious to one skilled in the art.

Figure 1:
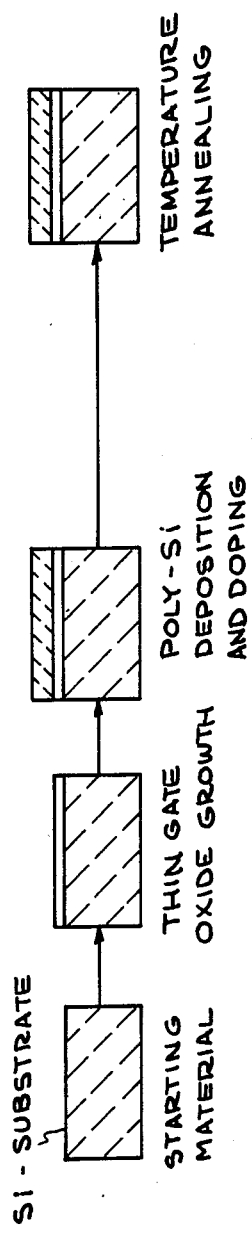
FIG. 1 is an idealized, simplified, schematic drawing of steps of a typical prior art process for forming a polysilicon gate for a MOS structure.
Figure 2:
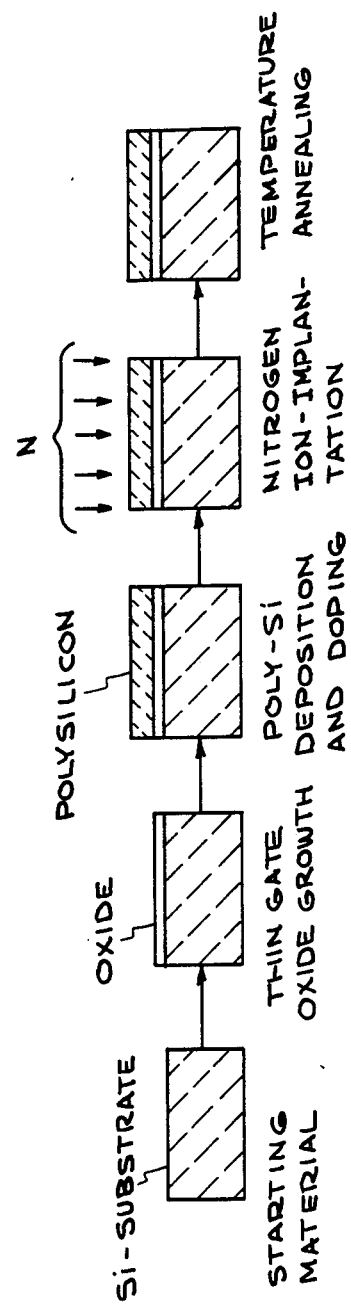
FIG. 2 is an idealized, simplified, schematic drawing of steps of the present invention process as applied to an exemplary formation of a polysilicon gate for a MOS structure.

FIG. 1 shows a typical sequence of process steps of the prior art fabrication of a MOS structure. FIG. 2 contrasts the process of FIG. 1 in accordance with the process of the present invention.

Figure 2A:
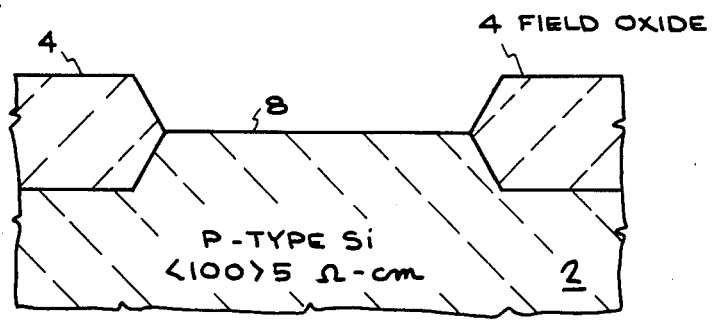
FIGS. 2a through 2d are a depiction of an idealized sequence of process steps for forming an improved thin oxide in accordance with the present invention.

Referring now to FIG. 2a, there is shown in cross-section a semiconductor substrate 2 which contains impurities to render the substrate to have a P type conductivity, viz., as is known to be commercially available in wafer form. Local oxidation of the silicon has been performed by any of the many known processes in the art to form field oxidation (FOX) isolation regions 4. It is between these FOX regions 4 that integrated circuit components, such as MOS devices, might be formed. In this exemplary embodiment, a simple test structure is formed to demonstrate the utility of the present invention.

Figure 2B:
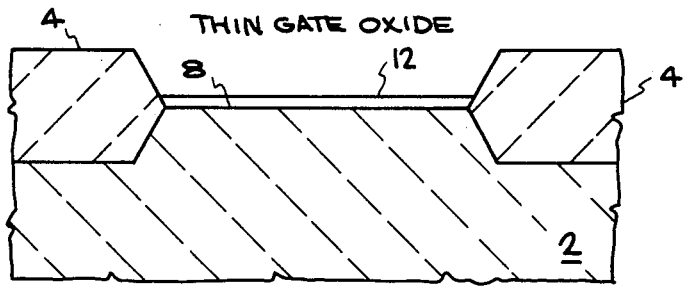

Referring to FIG. 2b, a thin oxide layer 12 is formed at surface 8, such as by oxidizing the surface until the desired thickness is achieved. In this example, a thin oxide layer 12 was grown to a thickness of approximately eighty-nine (89) Angstroms by thermal oxidation at 1000 degrees centigrade.

Figure 2C:
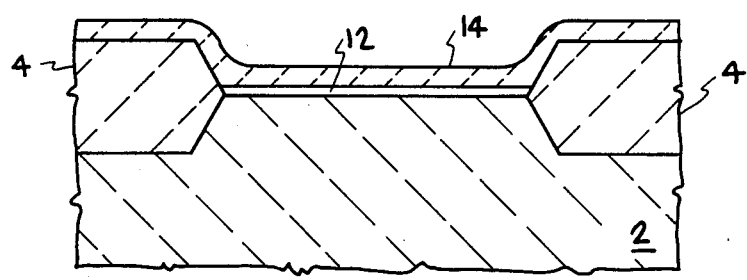

Next, as depicted in FIG. 2c, a polysilicon layer 14 is formed on the structure as shown in FIG. 2b. Such a polysilicon layer 14 is commonly used to form the gate regions of the MOS devices being constructed in the integrated circuit. Generally, this polysilicon layer 14 is doped, such as by known processes using a POCl$_3$ source. The polysilicon layer 12 is formed prior to the nitrogen implant in order to provide implant control and to prevent the escape of implanted nitrogen during later high temperature processing steps.

Figure 2D:
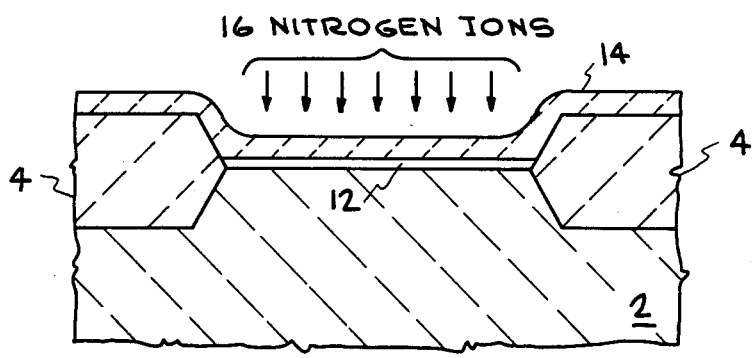

Next, as shown in FIG. 2d, a nitrogen ion implantation is performed, represented by the arrows labelled 16. In this example, an implant energy of 60 keV in a dosage of approximately $1 \times 10^{16}$ ions/cm$^2$ was performed to implant nitrogen ions into the polysilicon 14 and the oxide 12.

Figure 3:
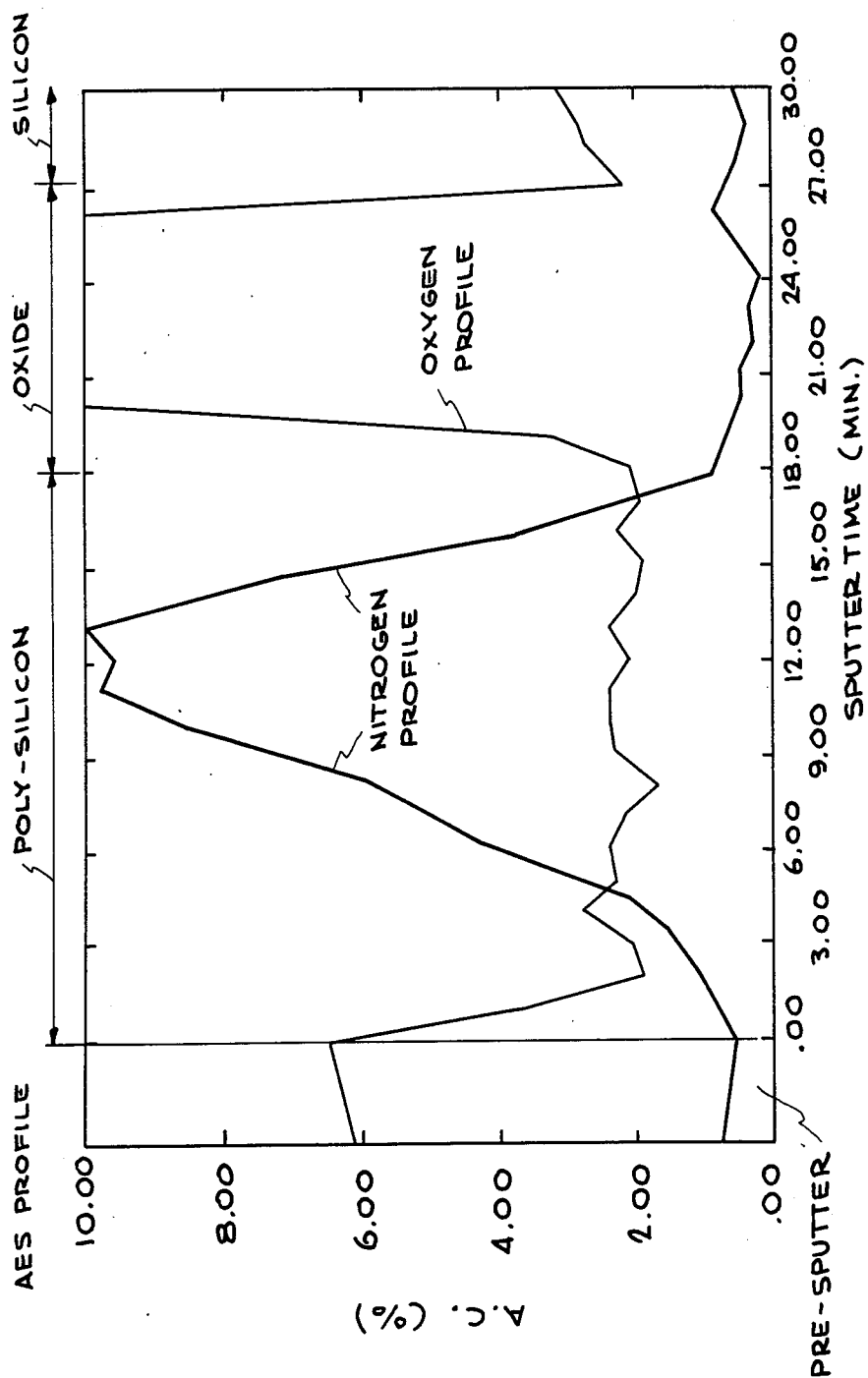
FIG. 3 is a graphical plot of an Auger depth profile of the structure as shown in FIG. 2d prior to further oxidation.

At this stage—namely, analogous to an intermediate stage of fabrication of an actual integrated circuit—certain measurements were taken to determine the nature of the mechanism of the nitrogen implantation. FIG. 3 is a graphical representation of the effects of said implant (known as an Auger profile made with a scanning electron microscope). The "N" line of the graph shows that the majority of nitrogen ions have essentially piled up near the center of the polysilicon layer 14 at this stage of the process.

Referring again to FIG. 2d, the structure is submitted to a high temperature thermal oxidation cycle, 1100 degrees centigrade, for approximately twenty minutes. One result is that the oxide layer 12 grows to approximately 400 Angstroms in thickness. Common masking and etching techniques were then performed to define test structures on the wafer. Referring back briefly to FIGS. 1 and 2, a comparison of the process differences can be studied.

Figure 4:
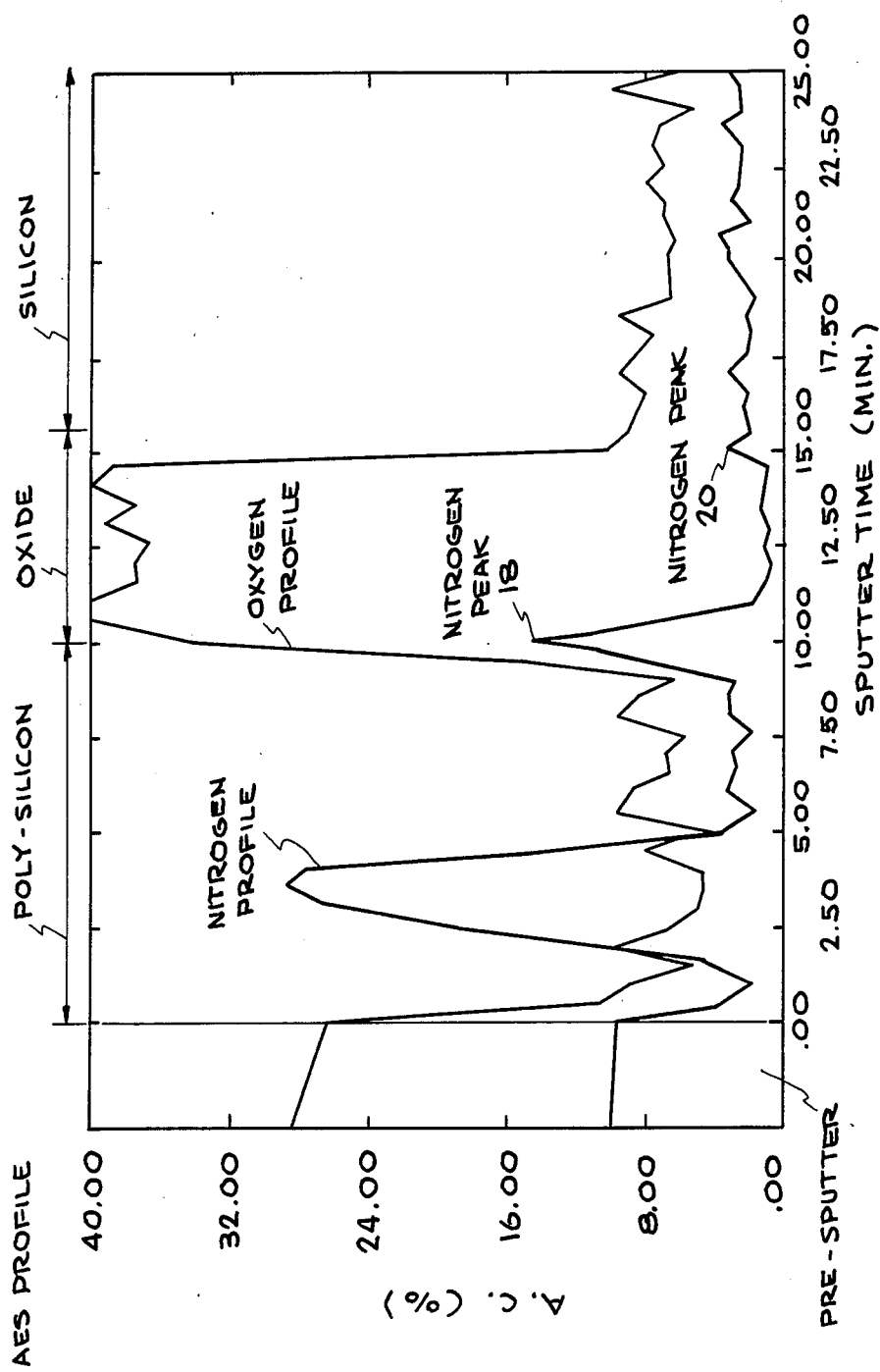
FIG. 4 is a graphical plot of an Auger depth profile of the structure as shown in FIG. 2d following further oxidation steps of the process.

Turning to FIG. 4, there is shown the effect of the high temperature cycle on the Auger profile of the structure. As clearly shown, the nitrogen profile changes significantly such that there is a pile-up of nitrogen at the polysilicon/silicon dioxide interface and again at the silicon dioxide/substrate interface. In other words, within the silicon dioxide layer 12 there are formed $Si_xN_y$ compounds at the interfaces of the silicon dioxide layer with adjacent layers (see FIG. 4, peak points 18 and 20).

While in this embodiment, a heating cycle is used to migrate the nitrogen ions to the boundary interfaces of the silicon dioxide and to form the silicon-nitrogen compounds. It will be apparent to one skilled in the art, that other possibilities for forming these compounds in these regions exist as equivalent methods.

Figure 5:
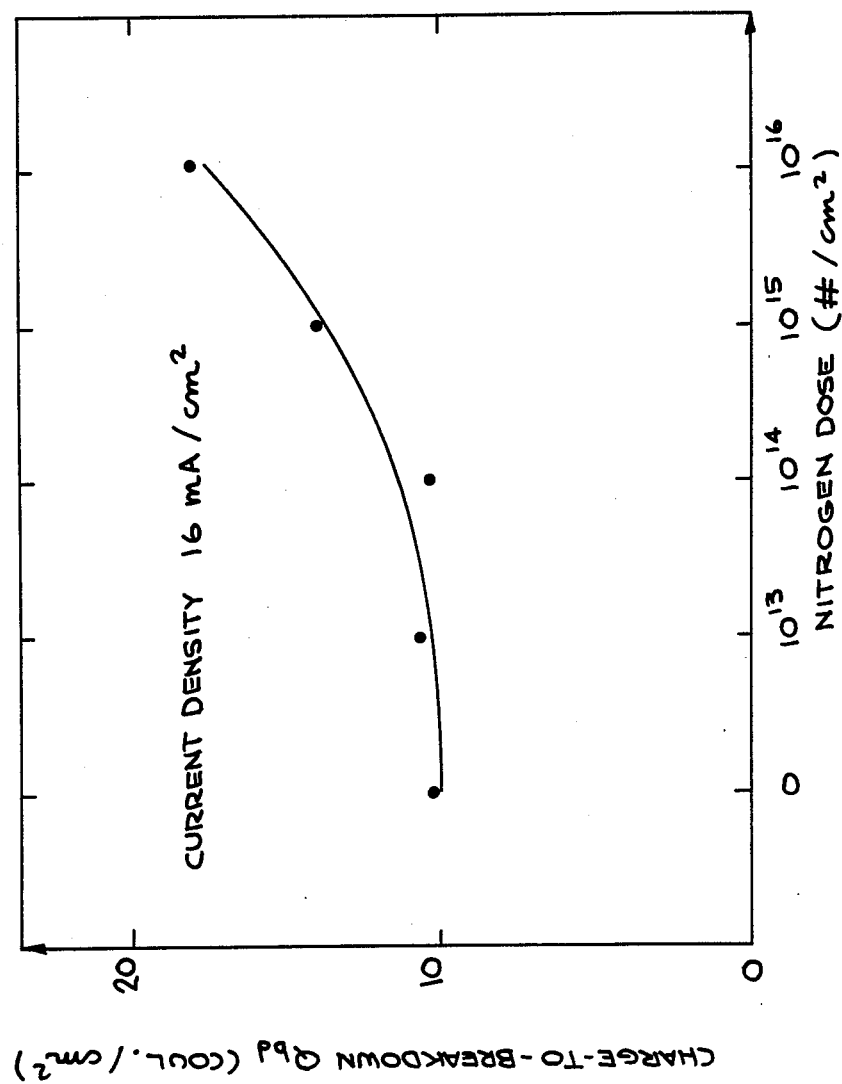
FIG. 5 is a graphical plot of charge-to-breakdown (Qbd) versus the nitrogen dosage.

Referring to FIG. 5, there is shown a graph plotting the charge-to-breakdown (Qbd) of an oxide layer having a thickness of approximately ninety Angstoms versus various nitrogen implant dosages. Qbd is the measurement of total electron flux passing through the oxide layer before reaching the destructive breakdown. Qbd is generally accepted in the art as a monitor for oxide integrity. Higher Qbd values indicate better oxide quality. It is abundantly clear that the introduced nitrogen in the silicon dioxide vastly improves the breakdown characteristics of the oxide layer.

In MOS technology, it is believed that thin oxide region breakdown is due in the main to the positive feedback phenomenon of gate current and consequential thermal runaway mechanisms. This process usually occurs in some localized weak spots in the oxide, which are introduced by the impurity diffusion either from the polysilicon gate or the substrate during the high temperature fabrication steps. Another factor which research indicates may affect oxide breakdown is the interface state density. Interface state density also increases with increased temperature, as would occur during the application of an electrical field across a thin, gate oxide.

Hence, it appears that by eliminating the impurity related defects and improving the quality of the oxide by forming silicon-nitrogen compound layers at the interfaces of a silicon dioxide region, the migration of impurity diffusion from adjacent layers is blocked. A depiction of the effect is shown in comparing FIGS. 6a (prior art) and 6b. Simultaneously, these boundary regions may also affect the interface state density mechanism.

FIGS. 7a and 7b compare oxide integrity for a conventional process as shown in FIG. 1 and for oxides prepared in accordance with the present invention as shown in FIGS. 2 and 2a through 2d, respectively. As shown, the average Qbd for the conventional process is in the order of 4 C/cm$^2$. For the present invention process, the average Qbd increases to approximately 8 C/cm$^2$.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in all technologies, such as with MOS, bipolar, or BiMOS processes. Similarly, any process steps described might be interchangable with other steps in order to achieve the same result. The embodiment was chosen and described in order to best explain the principles of the invention and its practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. In the fabrication of an integrated circuit structure, a method of forming an improved silicon dioxide region in the structure, characterized by the steps of:
   (a) forming a masking layer superjacent said silicon dioxide regions; and
   (b) introducing nitrogen ions into said masking layer and said silicon dioxide regions, such that silicon-nitrogen compounds are formed at upper and lower boundary regions of said silicon dioxide regions.

2. The method as set forth in claim 1, wherein said step of introducing nitrogen ions comprises:
   implanting said nitrogen ions.

3. The method as set forth in claim 1, wherein said step of introducing nitrogen ions is further characterized by:
   heat treating said structure such that said nitrogen ions react with said silicon dioxide to form silicon-nitrogen compounds at interfaces of said silicon dioxide regions with underlying and overlying layers of said structure.

4. The method as set forth in claim 1, wherein said step of forming a masking layer comprises:
   forming said masking layer of polysilicon.

5. The method as set forth in claim 4, wherein said step of forming said gate insulator regions further comprises:
   forming said silicon dioxide to have a thickness in the range of approximately 50 to 500 Angstroms.

6. In the fabrication of a field effect transistor (FET) structure, a method of reducing defects in a thin, FET gate insulator region, comprising the steps of:
   (a) forming a gate insulator region of silicon dioxide on a substrate;
   (b) forming a mask layer superjacent the silicon dioxide region;
   (c) implanting nitrogen ions into the silicon dioxide through the masking layer; and
   (d) heat treating said structure such that silicon-nitrogen compounds are formed at interfaces of said silicon dioxide with said masking layer and said substrate.

7. The method as set forth in claim 6, wherein said step of implanting nitrogen ions further comprises:
   implanting said ions in a dosage having a range of approximately $1 \times 10^{15}$/cm$^2$ to $1 \times 10^{16}$/cm$^2$, at 60 keV energy.

8. A method of fabricating an improved gate oxide for a silicon gate field-effect transistor (FET), comprising the steps of:
   (a) providing a gate oxide layer on a substrate;
   (b) providing a polysilicon layer on the gate oxide layer;
   (c) introducing nitrogen ions into the polysilicon layer; and
   (d) annealing the FET to introduce the nitrogen ions in the polysilicon layer into the gate oxide layer and to form silicon-nitrogen compounds in the gate oxide layer.

9. A method according to claim 8, wherein said step (d) comprises forming silicon-ntirogen compounds at interfaces of the gate oxide layer with the substrate and with the polysilicon layer.

10. A method according to claim 9, wherein said step (a) comprises providing a silicon dioxide gate oxide layer.

11. A method according to claim 9, wherein said step (c) further comprises introducing nitrogen ions into the gate oxide layer.

* * * * *